United States Patent [19]

Harris et al.

[11] Patent Number: 4,582,548

[45] Date of Patent: Apr. 15, 1986

[54] SINGLE CRYSTAL (SINGLE GRAIN) ALLOY

[75] Inventors: Kenneth Harris, Spring Lake; Gary L. Erickson, Muskegon, both of Mich.

[73] Assignee: Cannon-Muskegon Corporation, Muskegon, Mich.

[21] Appl. No.: 339,318

[22] Filed: Jan. 15, 1982

Related U.S. Application Data

[63] Continuation-in-part of Ser. No. 209,501, Nov. 24, 1980, abandoned.

[51] Int. Cl.$^4$ ............................................. C22C 19/05
[52] U.S. Cl. ...................................... 148/404; 148/3; 148/162; 148/410
[58] Field of Search ..................... 420/448; 148/3, 162, 148/404, 410

[56] References Cited

U.S. PATENT DOCUMENTS 4,116,723  9/1978  Gell et al. ............................ 148/162
4,209,348  6/1980  Duhl et al. ............................ 148/3
4,402,772  9/1983  Duhl et al. ............................ 148/404

Primary Examiner—R. Dean
Attorney, Agent, or Firm—Price, Heneveld, Huizenga & Cooper

[57] ABSTRACT

The alloy is a nickel base, superalloy specifically intended for the making of castings which consist of a single crystal. The castings are intended for use under extreme conditions of high temperature and stress. The alloy, for the first time, achieves the desired characteristics of phase stability, high stress-rupture strength and resistance to oxidation while maintaining a sufficient temperature differential between gamma prime solvus and incipient melting temperatures, that it is practical to solution heat treat without unacceptable percentages of rejects due to failure either to completely solution the primary coarse gamma prime or to initiation of incipient melting. In a modified form the coated oxidation/corrosion resistance of the alloy is increased by the addition of a trace quantity of hafnium.

11 Claims, 15 Drawing Figures

FIG.1
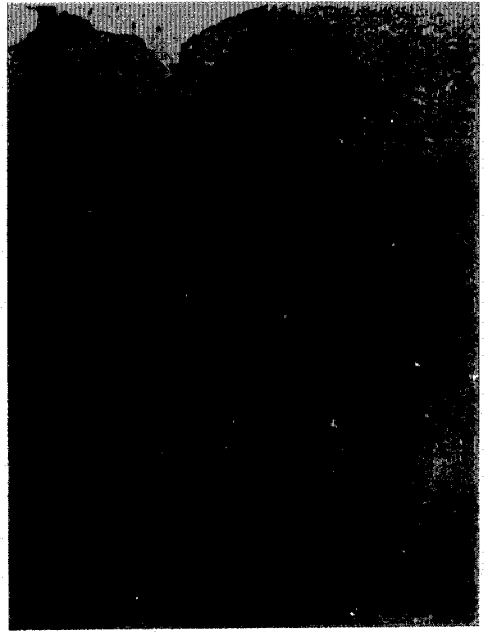
FIG. IA
FIG.2
FIG. 2A

FIG. 4A 400 X
FIG. 4 100 X

100 X

400 X

2350°F

100 X

400X

2375°F

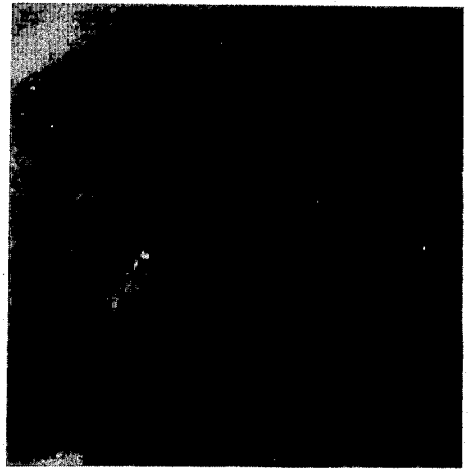
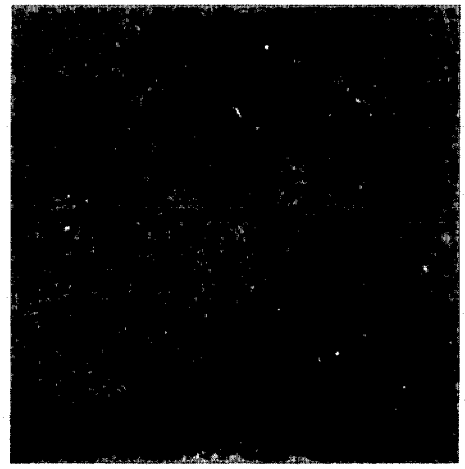
100 X  
FIG. 7
400 X  
FIG. 7A
2400°F
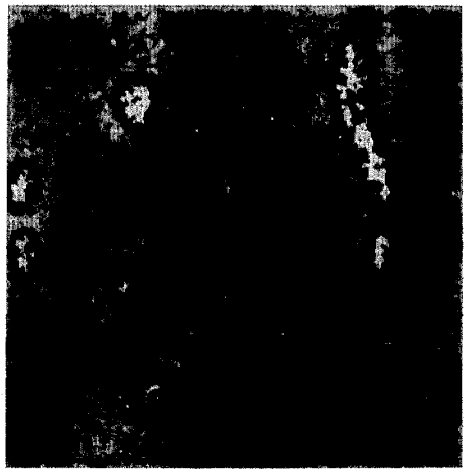
100 X  
FIG. 8
2425°F
400 X  
FIG. 8A

SINGLE CRYSTAL (SINGLE GRAIN) ALLOY

This application is a continuation in part of U.S. patent application, Ser. No. 209,501, entitled "Single Crystal (Single Grain) Alloy" filed Nov. 24, 1980, abandoned.

BACKGROUND OF THE INVENTION

This invention relates to single crystal alloys for high stress, high temperature application under conditions of long and continuous operation.

Alloys of this type are particularly essential in turbine blade technology in which resistance to oxidation and high temperature corrosion combined with high thermal fatigue and high creep strengths are essential. These alloys are commonly referred to as "superalloys".

The concept of alloys for casting single crystal parts was developed several years ago and its development can in part be followed in U.S. Pat. Nos. 3,494,709, 4,116,723 and 4,209,348. In addition to the alloys, process technology has been developed for the casting of single crystal alloy parts which prevent the growth of all grain structures except one. The techniques involved in such technology are not part of this invention, rather the invention being the development of an alloy which can be used with such techniques.

In the making of single crystal alloy parts, the part is first cast from an alloy suitable for single crystal technology. Process methods are employed during casting solidification to ensure only one grain forms in the mold cavity, which in fact, forms the part being cast such as a turbine blade. The resulting single crystal casting will, however, not be homogeneous because of substantial "coring" [dendritic segregation] of some of its elements. To eliminate this condition, the casting is subsequently heat treated. In so doing the casting must be heated to a sufficiently high temperature where all of the primary gamma prime strengthening precipitate and some of the eutectic goes into solution. This temperature, however, must be below that at which the casting starts to melt, i.e. the incipient melting point. The temperature range at which this can be accomplished may be called the "heat treatment window". The wider the "window", the greater the possibility that the heat treatment will be successful in solutioning all the primary gamma prime and some of the eutectic without incipient melting occurring. To the extent that there is a failure to solution all of the primary gamma prime in the final casting; there will be a reduction in high temperature strength. If the incipient melting point is reached, there will be a loss of ductility and likelihood of premature creep or fatigue failure due to void formation.

The single crystal alloys heretofore developed, have all had undesirable characteristics. If they had the desired resistance to high temperature fatigue and creep coupled with good oxidation and corrosion resistance, they had such a narrow heat treatment "window" that they were virtually impractical to heat treat on a production basis and lacked dependable repeatability. When it was attempted to widen the heat treatment "window", one of the alloys developed high temperature phase instability which resulted in the formation of plate-like/acicular phase of alphatungsten, alphachromium and mu phase. This has been found to be a progressive condition resulting in deterioration of long time creep and fatigue properties, once the formation of these conditions has been initiated.

BRIEF DESCRIPTION OF THE INVENTION

The invention creates a new alloy which has been proven by tests to develop a relatively wide "window", in the range of at least four to five times as wide as any previously obtained without sacrifice of the operating characteristics essential to maximum performance including creep strength and resistance to thermal fatigue, corrosion and oxidation. Microscopic examination reveals a higher degree of homogenization than heretofore obtained coupled with resistance to high temperature formation of deleterious phase precipitates such as alphatungsten, alphachromium and mu. These characteristics stem in part from the widening of the "window" and in part from an alloy formulation which stabilizes the casting against high temperature, high stress deleterious phase precipitation.

BRIEF DESCRIPTION OF THE DRAWINGS

FIG. 1 is a photomicrograph taken at 100× of a section in the as-cast condition taken from a single crystal turbine blade cast from the alloy of this invention;

FIG. 1A is a photomicrograph of the same section taken at 400×;

FIG. 2 is a photomicrograph taken at 100× of a section of an identical turbine blade after solution heat treatment;

FIG. 2A is a photomicrograph of the same section as FIG. 2 taken at 400×;

FIG. 4 is a photomicrograph taken at 100× of a section machined from a single crystal turbine blade withdrawal cast from the hafnium modified alloy of this invention in an "as-cast" condition;

FIG. 4A is a photomicrograph of the same section as illustrated in FIG. 4 above at 400×;

FIG. 7 is a photomicrograph taken at 100× of a section machined from a single crystal turbine blade withdrawal cast from the hafnium modified alloy of this invention after solutioning at 2400° F. for three hours with initial incipient melting appearing as dark spots on the photo;

FIG. 7A is a photomicrograph of the same section as illustrated in FIG. 7 taken at 400×;

FIG. 8 is a photomicrograph taken at 100× of a section machined from a single crystal turbine blade withdrawal cast from the hafnium modified alloy of this invention after solutioning at 2425° F. for three hours showing extensive incipient melting; and FIG. 8A is a photomicrograph of the same section as illustrated in FIG. 8 taken at 400×.

DESCRIPTION OF THE PREFERRED EMBODIMENT

Figure 3:
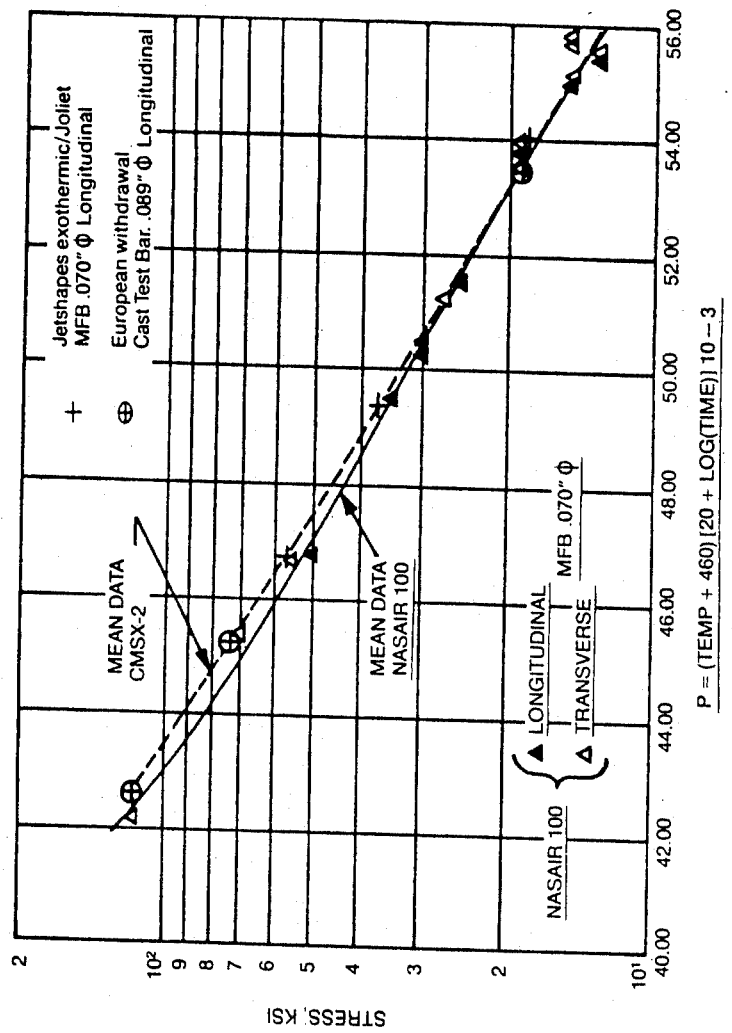
FIG. 3 is a graph comparing the high temperature/stress characteristics of the NasAir 100 alloy with those of the alloy of this invention.

In preparing the alloy of this invention, the concept of eliminating the so-called grain boundary strengthening elements has been retained from earlier known, single crystal alloys. Thus, to the extent possible, carbon, zirconium, hafnium and boron have been eliminated. However, the remaining elements have been rebalanced resulting in a formulation which has simultaneously eliminated both the problem of an excessively narrow heat treatment "windlow" and the problem of high temperature phase instability.

The following single crystal alloy has been developed from first principles, the composition being expressed as percentage of weight:

| Co | Cr | Mo | W | Ta | Al | Ti | Ni |
|----|----|----|---|----|----|----|----|
| 5 | 10 | 0 | 4 | 12 | 5 | 1.5 | Bal |

This alloy proved to have the requisite properties of creep strength, corrosion resistance, resistance to thermal fatigue and oxidation. However, it has proven to be very difficult to utilize because it reportedly has a "heat treatment window" limited to a range of 5° to 15° F. Thus, in heat treating this alloy to solution the primary gamma prime, the recommended solution temperature is 2345° F.±5° F., a virtually impossible range to maintain in production even with very sophisticated equipment. Thus, the rejection rate of the heat treated castings due to incipient melting has been excessive.

To overcome the restrictions imposed by the excessively narrow "heat treatment window" of the above initial single crystal alloy, the MAR M 247 alloy was modified by the Garrett Turbine Engine Co. (formerly known as AiResearch Manufacturing Co.).

Starting out with the equiaxe and directional casting (DS) alloy known to the trade as MAR M 247 having the composition by percentage of weight:

| Co | Cr | Mo | W | Ta | Al | Ti | Hf | C | Ni |
|----|----|----|---|----|----|----|----|----|----|
| 10 | 8.2 | 0.6 | 10 | 3 | 5.5 | 1.0 | 1.5 | .16 | Bal |

AiResearch produced a single crystal alloy having a "heat treatment window" of a practical range. This alloy, known as NasAir 100, had the composition expressed as percentage of weight:

| Co | Cr | Mo | W | Ta | Al | Ti | Ni |
|----|----|----|---|----|----|----|----|
| 0 | 9 | 1 | 10.5 | 3.3 | 5.75 | 1.2 | Bal |

The resulting alloy had the desired "heat treatment winow" range but upon exposure to high thermal and stress conditions it proved to be unstable. Under these conditions deleterious plate-like and acicular formations of alphatungsten and mu and to a lesser degree alphachromium began to appear. These rapidly multiplied to a point such that the thermal fatigue resistance and long term creep strength were materially, adversely affected. The thermal phase instability of this alloy will eliminate its utility as a superalloy.

The results of these alloy compositions have, in effect, limited the single crystal alloys intended for usage in situations which approach the outer parameters of thermal/stress operation to those castings of the initial, single crystal alloy which managed to survive the heat treatment process.

After many months of analysis and study of the causes and related effects of the prior single crystal alloy compositions, and using MAR M 247 as the base composition, it was believed that certain heretofore accepted metallurgical concepts in this field were not entirely valid. It had been considered that at least one percent of molybdenum was necessary to maintain the characteristic of a wide "window" but the presence of this element at this level was considered to be one of the significant factors in creating phase instability [mu contains Mo and W] in this type of grain boundary free casting. It was discovered that a half percent of molybdenum could be added to maintain the wide heat treatment without encountering the instability problem. Further, a relatively high tungsten content was considered essential to provide strength and a high chromium content to provide corrosion resistance. It was determined by experimentation that the quantities of both of these elements could be reduced and substituted with tantalum, without loss of the desired strength and oxidation/corrosion resistance characteristics at the upper extreme of the alloy's operating range. This substitution of Ta for W and Cr was also hoped to further improve the alloy's stability, i.e. prevent alphatungsten and alphachromium and mu phase formation. Later tests established the success of this substitution. Cobalt was alsoadded to increase the alloy's solid solubility. Aluminum and titanium contents were left at the same levels as in MAR M 247 alloy. The result of this work was an alloy of the following composition expressed as percentage of weight:

| Co | Cr | Mo | W | Ta | Al | Ti | Ni |
|----|----|----|---|----|----|----|----|
| 4.6 | 7.8 | 0.5 | 8.0 | 6.0 | 5.6 | 1.0 | Bal |

Subsequent metallographic tests with this alloy have proved it has a gamma prime solvus sufficiently lower than the alloy's incipient melting point to provide a practical "heat treatment window" of 50°-55° F. At the same time other tests have established its phase stability and its resistance to the formation of deleterious plate-like/acicular precipitates during long term exposure at high temperatures.

Turbine blade castings were made from this alloy using the single crystal casting technique. These castings were solution heat treated at 2400° F. with a final gas fan quench, at which temperature all of the primary gamma prime went into solution, along with much of the eutectic. The change in the microstructure of the alloy is clearly shown by comparing FIGS. 1 and 1A with FIGS. 2 and 2A. It is apparent from FIG. 1A taken at 400× before heat treatment that the primary gamma prime is non-uniform in both distribution and shape and is relatively large sized. After heat treatment the primary gamma prime has been rendered small and basically uniform in both size and shape. The gas fan quench results in the very fine gamma prime size of 0.2–0.3 microns. The result is a casting of uniform very fine gamma prime structure capable of developing and maintaining its maximum potential of strength and durability under high thermal/stress environments.

The experimentation which has been done to date indicates the following to be the composition range in which this alloy can be made:

TABLE I

| | Expressed as percentage of weight | | |
|---|---|---|---|
| | Min. | Max. | Optimum |
| Co | 4.3 | 4.9 | 4.6 |
| Cr | 7.5 | 8.2 | 7.8 |
| Mo | 0.3 | 0.7 | 0.5 |
| W | 7.6 | 8.4 | 8.0 |
| Ta | 5.8 | 6.2 | 6.0 |
| Al | 5.45 | 5.75 | 5.6 |
| Ti | 0.8 | 1.2 | 1.0 |
| Ni | Bal | Bal | Bal |
| C | 60 ppm max. | | |
| Zr | 50 ppm max. | | |
| Hf | 50 ppm max. | | |
| B | 30 ppm max. | | |
| S | 20 ppm max. | | |
| Si | 400 ppm max. | | |

It will be seen from Table I that the alloy of this invention is very narrow in composition range and any variation from this narrow range could lead to substantial loss of functional characteristics. While it would be desirable to totally eliminate the C, Ar, Hf, B and S elements, this is impractical because they become incorporate in trace amounts either as impurities with the primary elements or from the equipment used in processing the alloy such as the lining of melting furnaces and like vessels which must necessarily be used in making and handling the alloy.

EXAMPLE I

Single crystal, solid jet engine turbine blades having a 0.125 inch section were cast using the Jetshapes exothermic process from an alloy from Heat VF-267 within the range set out in Table I. This alloy had a practical "heat treatment window" of 50°-55° F. and an incipient melting point of 2435°-2440° F. These blades were heat treated at the Vac Hyde Process Corp., Los Angeles, Calif. They were solutioned three hours at 2400° F. and then gas fan quenched treated five hours at 1800° F. followed by twenty hours at 1600° F.

At Joliet Metallurgical Labs. specimens 0.070 inch in diameter were machined from the longitudinal direction [(001) crystallographic orientation] of the blade. These were then tested for high temperature stress-rupture with the following results:

| Specimen No. | Test Conditions | Time to Failure in Hours |
|---|---|---|
| 1. | 36 Ksi at 1800° F. | 72.7 |
| 2. | 36 Ksi at 1800° F. | 69.2 |
| 3. | 18 Ksi at 2000° F. | 98.2 |
| 4. | 18 Ksi at 2000° F. | 97.6 |
| 5. | 36 Ksi at 1800° F.* | 69.9 |
| 6. | 36 Ksi at 1800° F.* | 69.9 |
| 7. | 55.0 Ksi at 1600° F. | 529.1 |
| 8. | 55.0 Ksi at 1600° F. | 498.7 |

*20 hours 1600° F. aging cycle deleted.

Microscopic examination of the specimens taken from blades cast from the same heat disclosed the same uniform fine gamma prime structure shown in FIGS. 2 and 2A.

EXAMPLE II

From the same heat (VF-267) as Example I, ⅜ inch diameter, single crystal bars were cast using a European withdrawal process. Specimens 0.089 inch diameter were machined from the longitudinal section [(001) crystallographic orientation] after a solution heat treatment of three hours at 2400° F., then air cooled and treated five hours at 1800° F. and an additional twenty hours at 1600° F. to age. These were then tested for high temperature stress-rupture with the following results:

| Specimen No. | Test Conditions | Time to Failure in Hours |
|---|---|---|
| 1. | 105.9 Ksi at 1400° F. | 781 |
| 2. | 105.9 Ksi at 1400° F. | 882 |
| 3. | 105.9 Ksi at 1400° F. | 708 |
| 4. | 72.5 Ksi at 1562° F. | 263 |
| 5. | 72.5 Ksi at 1562° F. | 252 |
| 6. | 72.5 Ksi at 1562° F. | 228 |
| 7. | 18.6 Ksi at 1904° F. | 388 |
| 8. | 18.6 Ksi at 1904° F. | 378 |
| 9. | 18.6 Ksi at 1904° F. | 420 |

The results of the tests reported in the two preceding examples are compared graphically in FIG. 3 with similar tests performed on the NasAir 100 alloy. It is apparent from those tests that the alloy of this invention has a small improvement in stress-rupture strength over NasAir 100. However, it retains the wide "heat treatment window" without loss of alloy stability. Single crystal specimens of the alloy, in the as-cast condition have been aged for 100 hours at 1560° F., 1740° F. and 1920° F. Microscopic examination of all the aged specimens revealed no phase instability.

Similar tests were conducted on two additional heats (VF-312 and VF-332) with similar results, confirming the repeatability of results using this alloy.

It will be recognized that this is an alloy which must be both manufactured and cast under high vacuum conditions. This is essential to avoid gaseous contaminants such as oxygen and nitrogen. It is also essential to use specialized vessels to prevent contamination from such materials as C, B, Si, Zr and others which will enter an alloy from its container.

While the previously described alloy has good high temperature oxidation and moderate corrosion resistance, it would be materially improved by coating. Coating of gas turbine engine parts with aluminide or precious metal aluminide material is a known practice. Also known is coating with a CoCrAlY or a NiCoCrAlY metallic overlay applied, for example, by a vacuum plasma spray technique. Among the problems encountered with such coatings has been that of adhesion and cracking the related problems of coating integrity. It is important to obtain a bond which will remain effective over long periods of time at high temperatures and also under repeated temperature changes of over more than 1000° F. without separation or cracking.

It is also known that hafnium (Hf) when added to nickel-base support alloys contributes to the oxidation resistance of the uncoated alloy and materially improves both the adhesion and the oxidation and corrosion performance of the coating alloys. However, it also lowers both the gamma prime solvus and the incipient melting point of the single crystal alloy. Even though it lowers the gamma prime solvus, it was not known whether the shift in the gamma prime solvus, was at the same ar at a lower rate than the shift in the incipient melting point i.e. a possible significant narrowing of the solution heat treatment "window". Thus, hafnium has been considered as undesirable in single crystal alloy technology.

Despite these known characteristics of Hf and its use in nickel-base super alloys for single crystal, cast, high performance parts, it has now been determined that the addition of 0.1% Hf to the alloy composition set out in Table I produces the desired improvement in coating oxidation and particularly corrosion performance and adhesion characteristics without significant reduction in the heat treatment "window". This has not previously been considered possible because the addition of several times this amount of Hf was considered the threshold for producing any improvement in the oxidation/corrosion characteristics of coatings for nickel-base super alloys. The addition of Hf at such levels was known to narrow the solution heat treatment "window" to an impractical range. It also was not known exactly what effect this change might make in the other performance characteristics of the resulting alloy such as stability, stress-rupture properties, freckling and micro porosity. To determine these, preliminary tests were made by preparing a heat No. VF375 of the composition of Table I with the addition of 0.1% Hf. Single crystal solid blades of 0.125 inch section were vacuum cast using the withdrawal process from which MFB specimens 0.070 inch dia. were machined from the longitudinal direction. These specimens were solutioned 3 hours at 2375° F. then gas fan quenched. They were then pseudo coated 5 hours at 1800° F. and aged 20 hours at 1600° F. These were then tested for stress-rupture with the results set out in the following Table.

TABLE II

| TEST CONDITION | LIFE, hrs. | | |
|---|---|---|---|
| 106 Ksi/1400° F. | 504.3 | | 699.3 |
| 55 Ksi/1600° F. | 592.6 | | 602.4 |
| 70 Ksi/1600° F. | 142.8 | | 148.3 |
| 25 Ksi/1800° F. | 480.9 | 544.3 | 338.8 |
| 36 Ksi/1800° F. | 86.1 | | 67.4* + |
| 18.6 Ksi/1904° F. | 451.6 | 559.3 | 645.4 |
| 12 Ksi/2000° F. | 1259.8 | | 1475.2 |
| 18 Ksi/2000° F. | 71.6 | 63.0 | 184.1 |

*Thread Failure

From the same heat VF375, single crystal bars of 0.5 inch dia. were cast by the withdrawal process from which 0.250 inch dia. specimens were machined in the longitudinal direction. These specimens were solutioned 3 hours at 2400° F., then air cooled. They were then pseudo coated 5 hours at 1800° F. and aged 20 hours at 1600° F. They were then stress-rupture tested with the results set out in the following Table.

TABLE III

| TEST CONDITION | LIFE, hrs. |
|---|---|
| 60 Ksi/1650° F. | 179.8 |
| 35 Ksi/1800° F. | 90.8 |

The Hf Modified nickel-base single crystal alloy was subjected in the uncoated condition to dynamic oxidation at Mach 1 velocity at 2075° F. (1135° C.) with once per hour lowering of temperature to dull red heat. The tests indicate the alloy to have oxidation resistance equal to or slightly better than the same alloy without Hf. Based upon past experience with Hf containing alloys, the significant improvement in oxidation resistance is expected to be produced when the alloy is coated. Tests on parts cast from the alloy and vacuum plasma spray coated are currently in process. While the reason why this should occur is not understood, it is theorized that some of the Hf in the casting diffuses into the coating where, it is believed to cooperate with Yttrium in the coating to produce a markedly improved resistance to spalling. Yttrium alone is known to give a coating a tighter, that is, a more pore free, crack-free, type of oxide film. It is believed that the diffused Hf cooperates with and augments the sealing action of Yttrium.

Metallographic tests were done on specimens of the same type as those used to develop the data for Tables II and III. These specimens were subjected to 1600° F. for 602 hours, 1800° F. for 544 hours, 1904° F. for 645 hours and 2000° F. for 184 hours. Microscopic examination of the specimens revealed no indication of development of deleterious phase formation.

Heat treatment experiments conducted on heat VF 375 alloy established very little loss of "window" due to the addition of 0.1% Hf. The Hf modified alloy maintained a window of 45°-50° F. whereas the window for the non-Hf alloy is 50°-55° F. In view of these tests the selected optimum solution temperature for the modified alloy is 2375° F. The results of the tests conducted to determine the usable solution heat treatment "window" temperature range of the Hf modified alloy are illustrated in FIGS. 4 and 4A through 6 and 6A.

Figure 5:
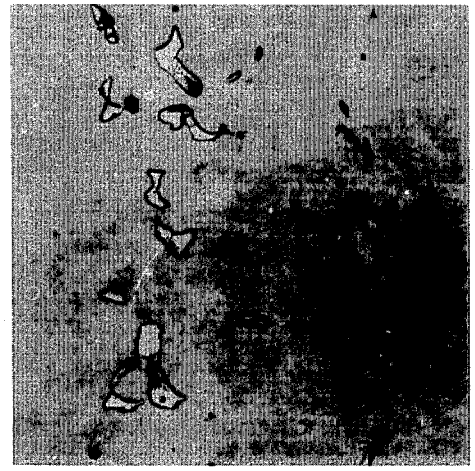
FIG. 5 is a photomicrograph taken at 100× of a section machined from a single crystal turbine blade withdrawal cast from the hafnium modified alloy of this invention after solutioning at 2350° F. for three hours.
Figure 5A:
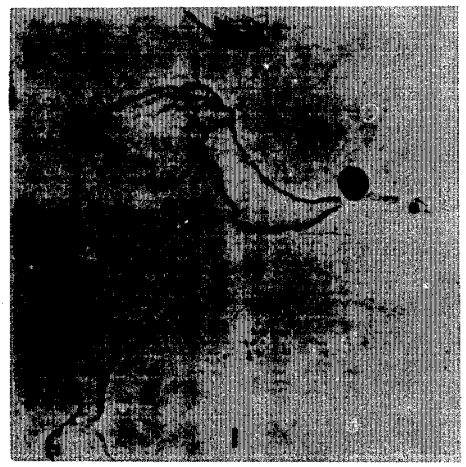
FIG. 5A is a photomicrograph of the same section as illustrated in FIG. 5 taken at 400×.
Figure 6:
FIG. 6 is a photomicrograph taken at 100× of a section machined from a single crystal turbine blade withdrawal cast from the hafnium modified alloy of this invention after solutioning at 2375° F. for three hours.
Figure 6A:
FIG. 6A is a photomicrograph of the same section as illustrated in FIG. 6 taken at 400×.

FIGS. 4 and 4A illustrate the microstructure of the single crystal blade in an as-cast condition before solutioning and aging. FIGS. 5 and 5A illustrate the change in microstructure after heat treatment at 2350° F. It will be noted that a very marked improvement in structural homogenity appears in heat treatment to 2375° F. (FIGS. 6 and 6A). At 2350° F., traces of the matrix gamma prime are present, all of which disappears at 2375° F. with some of the eutectic gamma prime being solutioned. At 2400° F. FIGS. 7 and 7A show that all the eutectic gamma prime has solutioned and the threshold of incipient melting has been reached with small, isolated areas, appearing as dark spots, where this has occurred. FIGS. 8 and 8A illustrate the fact that at 2425° F. unacceptably severe incipient melting has occurred. These solution heat treat microstructure analyses of the Hf modified alloy establish that it has a commercially practical "window" range of 45°-50° F.

Complex cored, thin walled, shrouded turbine blades incorporating difficult advanced technology were cast from the Hf modified alloy to determine what freckling characteristics it would produce. The result was blades which were "substantially freckle free".

The addition of the small amount of Hf is believed to have improved the coated oxidation and particularly corrosion resistance without unacceptable contraction of the "window" between gamma prime solvus and initiation of incipient melting. It is believed that this balance of characteristics can be maintained within a practical range when the addition of Hf is limited to 0.05 to 0.15 percent of the alloy composition.

An important facet of maintaining as broad a "window" as possible is to permit reuse, that is, reverting of the alloy which becomes waste during casting and the alloy available in reject castings. Each time the alloy is melted and cast there is the addition of traces of elements from the core, mold and the handling equipment (e.g. Si, Zr), plus the loss of some of certain of the element constituents. In super alloys of this type, the resulting changes in composition, even though small in proportion, have substantial effects upon the alloy's characteristics such as closing of the heat treat "window". By providing a wide "window" having a wide initial temperature range, such losses in this temperature range can be tolerated, making revert use of the alloy possible. This is a significant reduction in overall costs.

The invention provides the first microstructurally stable, single crystal alloy having heat treat "window" characteristics which make it possible to obtain satisfactory castings without an excessive rejection rate. As such, this invention makes very high performance, single crystal (single grain) castings a practical and producible product rather than a product, too costly for all but the most exotic applications.

That for which an exclusive right is claimed is set forth in the following claims.

The embodiments of the invention in which an exclusive property or privilege is claimed are defined as follows:

1. A single crystal casting to be used under high stress, high temperature conditions in an oxidizing environment and capable of total primary gamma prime solutioning during heat treatment at a temperature of up to 55° F. below the incipient melting temperature without incipient melting and cast from an alloy having no Hf and consisting essentially of the following elements in the following proportions expressed as percentages of weight:

Co: 4.6
   Cr: 7.8
   Mo: 0.5
   W: 8.0
   Ta: 6.0
   Al: 5.6
   Ti: 1.0
   Ni: Bal

2. A single crystal casting to be used under high stress, high temperature conditions in an oxidizing environment and capable of total primary gamma prime solutioning during heat treatment at a temperature of up to 55° F. below the incipient melting temperature without incipient melting and cast from an alloy having no Hf and consisting essentially of the following elements in the following range of proportions expressed as percentages of weight:

Co: 4.3–4.9
   Cr: 7.5–8.2
   Mo: 0.3–0.7
   W: 7.6–8.4
   Ta: 5.8–6.2
   Al: 5.45–5.75
   Ti: 0.8–1.2
   Ni: Balance 3. The casting described in either claims 1 or 2 wherein each of the following elements as unintentional additions may be present in the alloy in the proportion of parts per million maximum:

C: 60
   Zr: 50
   Hf: 50
   B: 30
   S: 20
   Si 400

4. The single crystal casting described in either claims 1 or 2 wherein the alloy from which it was cast is characterized by a heat treatment "window" of 50°–55° F., an incipient melting point of 2435°–2440° F. and a gamma prime solvus of 2385° F.

5. The casting described in claim 4 further characterized the alloy from which it was cast is capable of total solution of its gamma prime in three hours of heat treatment at 2400° F.

6. The casting described in claim 4 wherein the alloy from which it is cast is characterized by resistance to precipitation of constituent elements and the formation of deleterious plate-like and/or acicular precipitates during continuous exposure to temperatures in the range of 1600° F. −200° F.for long periods of time.

7. A single crystal blade or vane for a gas turbine engine cast from an alloy having no Hf and characterized by a heat treatment "window" of 50°–55° F., an incipient melting point of 2435°–2440° F., a gamma prime solvus of 2385° F. and capable of total primary gamma prime solutioning at 2400° F. and freedom from the precipitation of deleterious plate-like and/or acicular and particulate precipitates during 1000 hours of continuous exposure at temperatures in excess of 1800° F. and consisting essentially of the following range of elements in the following proportions expressed as percentages of weight:

Co: 4.3–4.9
   Cr: 7.5–8.2
   Mo: 0.3–0.7
   W: 7.6–8.4
   Ta: 5.8–6.2
   Al: 5.45–5.75
   Ti: 0.8–1.2
   Ni: Balance 8. A gas turbine engine blade or vane as claimed in claim 7 solution treated at 2400° F. for three hours and then gas fan quenched.

9. The casting as claimed in either claims 1 or 2 cast as a blade for a gas turbine engine.

10. The casting as claimed in either claims 1 or 2 cast as a vane for a gas turbine engine.

11. A single crystal super alloy casting for use in a gas turbine engine cast from an alloy having no Hf and consisting essentially of the elements expressed as percentage of weight Co 4.3–4.9, Cr 7.5–8.2, mo 0.3–0.7, W 7.6–8.4, Ta 5.8–6.2, Al 5.45–5.75, Ti 0.8–1.2, balance Ni and as cast having an incipient melting temperature approximately 50° F. (27.8° C.) higher than its gamma prime solvus temperature, said casting being capable of heat treatment at a temperature and for a time period sufficient to solutionize all its primary gamma prime without any incipient melting.

* * * * *

UNITED STATES PATENT AND TRADEMARK OFFICE
CERTIFICATE OF CORRECTION

PATENT NO. : 4,582,548

DATED : April 15, 1986

INVENTOR(S) : Kenneth Harris et al.

It is certified that error appears in the above-identified patent and that said Letters Patent is hereby corrected as shown below:

Column 3, line 12:
 "windlow" should be --window--
Column 3, line 56:
 "winow" should be --window--
Column 4, line 29:
 "alsoadded" should be --also added--
Column 5, line 21:
 "Ar" should be --Zr--
Column 5, lines 22 & 23:
 "incorporate" should be --incorporated--
Column 6, line 20:
 "those" should be --these--
Column 6, line 25:
 "100" should be --1000--
Column 6, line 53:
 "support" should be --super--
Column 6, line 61:
 "ar" should be --or--
Column 10, line 17, Claim 6:
 "200°" should be --2000°--
Column 10, line 48, Claim 11:
 "mo" should be --Mo--

Signed and Sealed this

Thirtieth Day of September 1986

[SEAL]

Attest:

DONALD J. QUIGG

Attesting Officer

Commissioner of Patents and Trademarks